(12) United States Patent
Meade

(10) Patent No.: US 8,995,805 B2
(45) Date of Patent: Mar. 31, 2015

(54) METHOD AND APPARATUS PROVIDING A COUPLED PHOTONIC STRUCTURE

(75) Inventor: Roy Meade, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 470 days.

(21) Appl. No.: 13/452,064

(22) Filed: Apr. 20, 2012

(65) Prior Publication Data

US 2013/0279848 A1 Oct. 24, 2013

(51) Int. Cl.
*G02B 6/26* (2006.01)
*G02B 6/42* (2006.01)

(52) U.S. Cl.
CPC ............ *G02B 6/4203* (2013.01); *G02B 6/4289* (2013.01); *G02B 6/4291* (2013.01)
USPC ..................... 385/32; 385/14; 385/30; 385/88

(58) Field of Classification Search
None
See application file for complete search history.

(56) References Cited

U.S. PATENT DOCUMENTS

| 4,824,199 | A  | * | 4/1989  | Uken ............................... 385/32  |
| 5,193,131 | A  | * | 3/1993  | Bruno ............................. 385/14  |
| 6,681,069 | B2 |   | 1/2004  | Galarza et al. |
| 6,991,892 | B2 | * | 1/2006  | Block ............................ 430/321 |
| 7,298,949 | B2 |   | 11/2007 | Gothoskar et al. |
| 7,613,369 | B2 |   | 11/2009 | Witzens et al. |
| 8,148,794 | B2 | * | 4/2012  | Masini et al. ................. 257/432 |
| 8,633,067 | B2 | * | 1/2014  | Assefa et al. .................. 438/154 |
| 2003/0026515 | A1 |   | 2/2003  | Barenburg et al. |
| 2004/0022495 | A1 |   | 2/2004  | Shapiro et al. |
| 2004/0179806 | A1 | * | 9/2004  | Block et al. ................... 385/146 |
| 2008/0192241 | A1 | * | 8/2008  | He .................................. 356/73.1 |
| 2009/0297099 | A1 | * | 12/2009 | Benjamin et al. ............... 385/32 |
| 2009/0324164 | A1 | * | 12/2009 | Reshotko et al. ............... 385/14 |
| 2011/0012221 | A1 |   | 1/2011  | Fujikata et al. |
| 2011/0170819 | A1 |   | 7/2011  | Zheng et al. |

FOREIGN PATENT DOCUMENTS

EP    0 331 338 A2    9/1989
GB    1 525 985       9/1978

OTHER PUBLICATIONS

Chen et al., "integrated $GH_z$ silicon photonic interconnect with micrometer-scale modulators and detectors," School of Electrical and Computer Engineering, Cornell University, Ithaca, NY 14853, Aug. 17, 2009, vol. 17, Optics Express 15248-15256.
Feng et al., "High-speed Ge photodetector monolithically integrated with large cross-section silicon-on—insulator waveguide," Applied Physics Letter 95, 261105, (Dec. 29, 2009), three (3) pages.
Yamada et al., "Si Photonic Wire Waveguide Devices," IEEE Journal of Selected Topics in Quantum Electronics, vol. 12, No. 6, Nov./Dec. 2006, pp. 1371-1379.
Hunsperger, "Waveguide Loss—Bend Loss," Integrated Optics, 4th Edition, pp. 84-87.

(Continued)

*Primary Examiner* — Hemang Sanghavi
(74) *Attorney, Agent, or Firm* — Dickstein Shapiro LLP

(57) ABSTRACT

Described embodiments include optical connections for electronic-photonic devices, such as optical waveguides and photonic detectors for receiving optical waves from the optical waveguides and directing the optical waves to a common point. Methods of fabricating such connections are also described.

15 Claims, 7 Drawing Sheets

(56) References Cited

OTHER PUBLICATIONS

Thyagarajan et al., "Accurate Numerical Method for the Calculation of Bending Loss in Optical Waveguides Using a Matrix Approach," Optics Letters, vol. 12, No. 4, Apr. 1987, pp. 296-298.

Hammer et al., "Total Multimode Reflection at Facets of Planar High-Contrast Optical Waveguides," and E. van Groesen, Journal of Lightwave Technology, vol. 20, No. 8, Aug. 2002, pp. 1549-1555.

Verdeyen, "Resonant Optical Cavities," Laser Electronics 1st Edition, pp. 112-121.

* cited by examiner

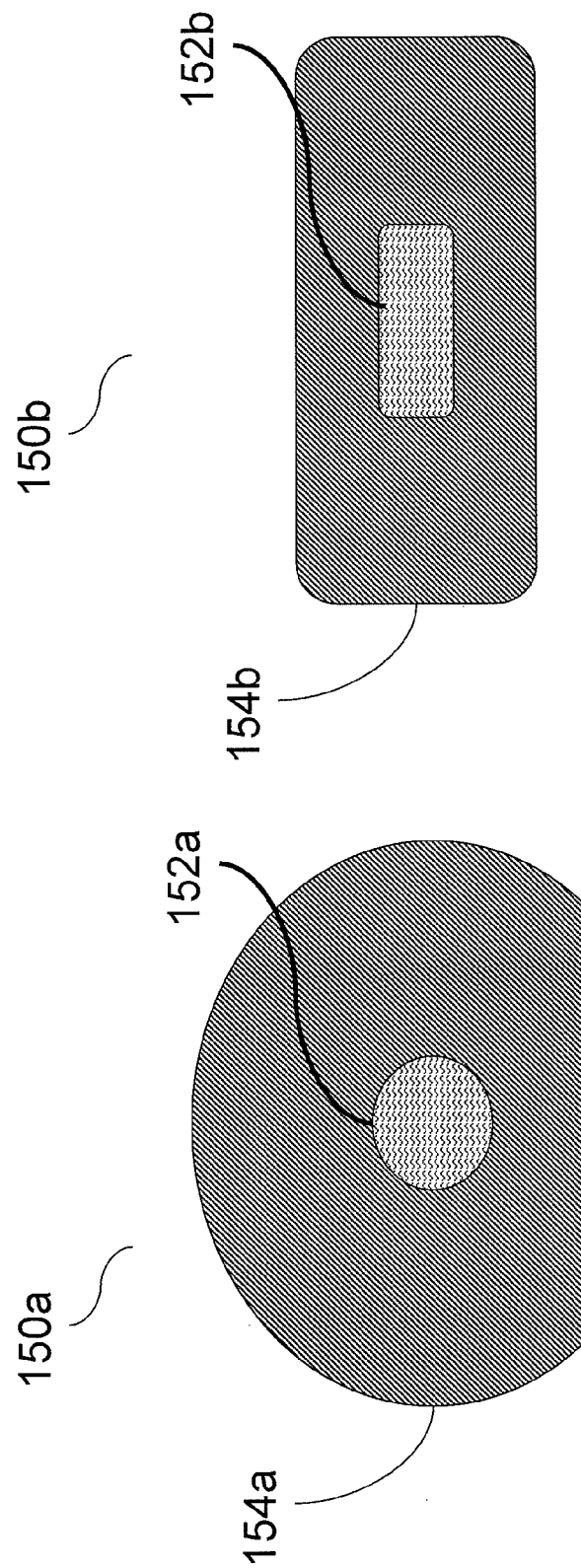

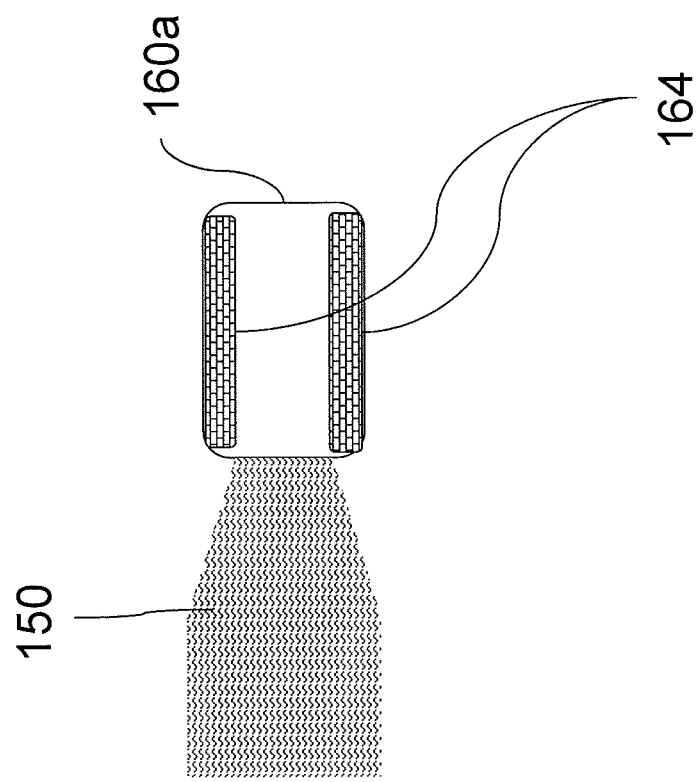

METHOD AND APPARATUS PROVIDING A COUPLED PHOTONIC STRUCTURE

TECHNICAL FIELD

Embodiments disclosed herein relate generally to the field of electronic devices (e.g., semiconductor devices) and more particularly to electronic-photonic devices.

BACKGROUND

Optical transmission may be used as a means for communication between separate integrated circuit chips (inter-chip connections) and within components on the same chip (intra-chip connections). Electronic-photonic devices, also known as optoelectronic devices, are a class of electronic devices that are capable of sourcing, controlling, and/or detecting light. Electronic-photonic devices include both electronic and photonic functions. In response to more demanding communication bandwidth, energy consumption, and performance standards for electronic devices such as semiconductor devices, photonic devices are increasingly being integrated with optical/electrical circuits to form a type of electronic-photonic device called an electronic-photonic integrated circuit.

For example, in the semiconductor industry, photonic devices have various applications including communication within a chip, between chips of a computer board, and between computer boards. In chip-to-chip communication via optical interconnects, each chip on the circuit board can be interfaced with a photonic-electronic transmitter-receiver circuit, with two chips operably connected via an optical waveguide. Likewise, optical waveguides may be used to connect components within a chip, such as between an integrated optical source and a photonic detector. Another benefit of electronic-photonic devices is that the elements that perform the pure optical functions, the pure electrical functions and the optoelectronic functions may be formed concurrently, on the same or different substrate, using existing manufacturing processes such as complementary metal oxide semiconductor (CMOS) semiconductor manufacturing processes.

FIG. 1 illustrates a block diagram of one example of a conventional electronic-photonic device 100. Electronic-photonic device 100 may be used to operably connect elements, such as integrated circuits, on a single chip or substrate, or devices on separate substrates.

Electronic-photonic device 100 includes a light source 120 configured to generate an optical beam. Light source 120 may be, for example, a coherent light source, such as a laser (such as a hybrid silicon laser or a gallium arsenide laser), a coherent light-emitting diode (LED), a superluminescent diode, or other appropriate light source known in the art. A coherent light source is a light source typically having a narrow wavelength band that is consistent and in-phase. Light source 120 may be configured to output an optical beam having a wavelength in a range of approximately 1,200 nm to 1,550 nm.

An optical waveguide 130 connects the optical beam of light source 120 to a modulator 140, such as an optical ring resonator with a PIN junction. Modulator 140 modulates the received light beam with received electrical data 145, and outputs the modulated optical data along another waveguide 150. Modulator 140 is also capable of passing the optical beam through without modulation, such as when the optical beam has already been modulated by another modulator 140 in a same electronic-photonic system.

Photonic detector 160 includes a semiconductor material 162 (such as germanium (Ge), silicon germanium (SiGe), indium gallium arsenide (InGaAs), indium phosphate (InP) or other appropriate materials) that is configured to receive and collect the modulated optical beam. The electrical response is transmitted to one or more electrodes 164 that generate an electrical response upon receiving the energy of the wavelengths of the modulated optical data, and provide an external electrical connection for the received optical data.

FIGS. 2A and 2B show cross-sectional views of two examples of optical waveguides 150a, 150b, respectively. Optical waveguides 150a, 150b both include a respective inner core 152a, 152b and outer cladding 154a, 154b.

Optical waveguide 150a (FIG. 2A) is an elliptically-shaped optical waveguide. Optical waveguide 150a is typical of a waveguide that may be formed as an optical fiber, such as a single mode or multi-mode optical fiber or other element separate from the substrate or chip to which the other photonic devices (e.g., light source 120, photonic detector 160, etc.) are formed. Outer core 154a may be, for example, a silicon dioxide ($SiO_2$) material. Inner core 152a may be, for example, a silicon (Si) material, such as $SiO_2$ doped with impurities such as $GeO_2$, and typically has very small dimensions compared to outer cladding 154a. For example, inner core 152a may have a radius of approximately 9 μm, while outer cladding 154a may have a radius of approximately 125 μm.

Optical waveguide 150b (FIG. 2B) is a rectangular-shaped waveguide. Optical waveguide 150b is typical of an integrated optical waveguide that may be formed on a semiconductor, such as a silicon substrate, a silicon-on-insulator (SOI) substrate, or a printed circuit board (PCB), using lithographic processing. For example, an integrated optical waveguide 150b formed on a $SiO_2$ substrate that acts as the outer cladding 154b may have a rectangular inner core 152b formed of, for example, a silicon (Si) material. Inner core 152b may have a diameter of approximately 300 nm, while outer cladding 154b is part of the larger substrate upon which optical waveguide 150b is formed and may have a diameter of approximately 1 μm or potentially much larger.

Wave guiding of an optical beam through waveguide 150a, 150b occurs through internal reflection of electromagnetic waves of an optical beam at the interface between the higher refractive index inner core 152a, 152b and the lower refractive index outer cladding 154a, 154b. Inner core 152a, 152b is formed of a material with a greater refractive index than the index of the material forming the outer cladding 154a, 154b. The refractive index of inner core 152a, 152b may be only slightly higher (e.g., 1%) than the refractive index of outer cladding 154a, 154b, or may be significantly higher (referred to as a "high contrast waveguide") in order to provide greater total internal refraction (TIR). For example, inner core 152a, 152b may be formed of a silicon (Si) material with a refractive index of approximately 3.5, while outer cladding 154a, 154b may be formed of a silicon dioxide ($SiO_2$) material with a refractive index of approximately 1.5.

It should be understood that outer cladding 154a, 154b can be formed of any material having a lower refractive index than the index of the inner core 152a, 152b. For example, ambient air, having a refractive index of approximately 1.0, may be used as outer cladding for an optical waveguide 150 having a Si inner core, and thus the cladding need not necessarily use a separate material. It should also be understood that both optical waveguides 130, 150 (FIG. 1) may have similar or different characteristics to those described above in connection with FIGS. 2A and 2B.

FIGS. 3A and 3B illustrate two top-down views of optical connections between an optical waveguide 150 and a photonic detector 160a, 160b. FIG. 3A shows a photonic detector 160a with optical waveguide 150 butt-coupled to the photonic detector 160a. Butt-coupled connections for photonic detectors require minimal length for the interconnection. However, the different refractive indexes between optical waveguide 150 and the semiconductor material of photonic detector 160a can cause energy from the optical beam to be reflected back into the optical waveguide 150. For example, optical waveguide 150 may be composed of Si having a refractive index of approximately 1.5, while photonic detector 160a may be composed of, e.g., Ge having a refractive index of approximately 4.34. This reflection is known as "return loss," and in addition to diminishing the strength of the optical signal that is received by photonic detector 160a, can interfere with operation of light source 120 (FIG. 1).

FIG. 3B shows a photonic detector 160b with the optical waveguide 150 evanescent-coupled to the photonic detector 160b, which is composed of photonic detector portions $160b_1$ and $160b_2$. Photonic detector portions 160b1, 160b2 surround optical waveguide 150, but are separated from optical waveguide 150 by distances $d_1$, $d_2$, respectively. In evanescent coupling, optical waveguide 150 is placed close to photonic detector portions $160b_1$, $160b_2$ so that an evanescent field (i.e., a near-field standing wave formed at the boundary between inner core 152b and outer cladding 154b of FIG. 5B) generated by the transmission of the optical beam in optical waveguide 150 reaches photonic detector portions $160b_1$, $160b_2$ before fully decaying. Distances $d_1$, $d_2$ must be small enough that the intensity of the evanescent field from optical waveguide 150 does not fully diminish before it is detected by photonic detector portions $160b_1$, $160b_2$. For example, distances $d_1$, $d_2$ may be approximately 10 μm or less. The evanescent field from optical waveguide 150 gives rise to propagating-wave modes on photonic detector portions $160b_1$, $160b_2$, thereby connecting (or coupling) the wave from optical waveguide 150 to photonic detector portions $160b_1$, $160b_2$.

Evanescent-coupled photonic detectors 160b have lower return loss than butt-coupled photonic detectors 160a (FIG. 3A), but typically require longer path-lengths (e.g., approximately 50 μm or more) than butt-coupled photonic detectors 160a. This increases the footprint required for photonic detector 160b and thus the overall size of the electronic-photonic device 100 (FIG. 1).

Accordingly, it is desirable to provide an optical connection between an optical waveguide and a photonic detector with low return loss yet a small path-length.

BRIEF DESCRIPTION OF THE DRAWINGS

FIGS. 2A and 2B illustrate cross-sectional diagrams of conventional optical waveguides.

FIGS. 3A and 3B illustrate top-down views of conventional optical connections for an optical waveguide and a photonic detector.

DETAILED DESCRIPTION

In the following detailed description, reference is made to various embodiments of the invention. These embodiments are described with sufficient detail to enable those skilled in the art to practice them. It is to be understood that other embodiments may be employed, and that various structural, logical and electrical changes may be made. In addition, where various processes are described, it should be understood that the steps of the processes may occur in an order other than how they are specifically described, unless noted otherwise.

Embodiments described herein make advantageous use of a phenomenon known as bending loss that occurs with optical waveguides. When an optical beam travels in an optical waveguide, a near-field standing wave, referred to as an evanescent wave, is formed at the boundary between the inner core and outer cladding of the optical waveguide. When a bend occurs in the optical waveguide, the portion of the evanescent wave located outside of the border between the inner core and the outer cladding must travel faster than the portion of the wave located inside of the inner core, in order to maintain the same angular velocity. At a point referred to as the "critical radius," the evanescent wave cannot travel fast enough in the respective medium to maintain the same angular velocity as the portion of the wave inside of the waveguide, and the energy of this portion propagates outward from the waveguide in a radial direction away from the curved waveguide.

Bending loss is typically considered an obstacle in optical waveguide design. The embodiments described below, however, exacerbate and take advantage of this phenomenon to provide a connection between an optical waveguide and a photonic detector.

Figure 4:
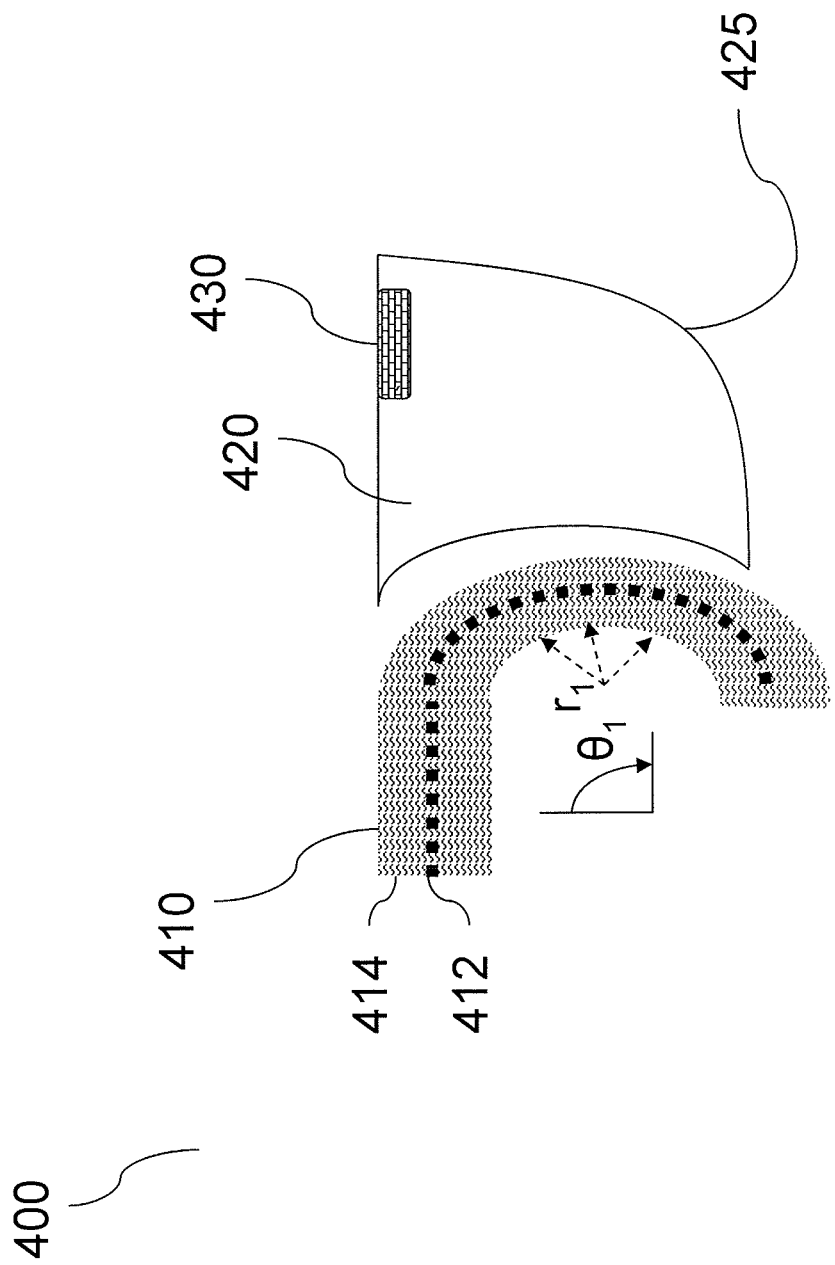
FIG. 4 illustrates a top-down view of an optical connection, in accordance with embodiments described herein.

FIG. 4 illustrates a top-down view of an optical connection 400 between an optical waveguide 410 and a photonic detector 420. Optical connection 400 may be formed, for example, on a substrate such as a silicon substrate, a silicon-on-insulator (SOI) substrate, a silicon dioxide (SiO$_2$) substrate, or a printed circuit board (PCB). Alternatively, elements of optical connection 400 may be formed on multiple separate substrates (e.g., Si, SiO$_2$, SOI, or other suitable substrates).

Optical waveguide 410 includes an internal core 412 and outer cladding 414, and may be integrated into a substrate (e.g., a common substrate with photonic detector 420), or may be, e.g., a single mode or dual mode optical fiber. Inner core 412 may be formed of, for example, a Si material, and have a width of approximately 300 nm. Outer cladding 414 may be formed of, for example, SiO$_2$. Inner core 412 may be patterned in outer cladding 414 using known processes.

Photonic detector 420 is composed of a semiconductor material, such as germanium (Ge), silicon germanium (SiGe), indium gallium arsenide (InGaAs), indium phosphate (InP) or other appropriate materials, that generates an electrical response upon receiving an optical wave from optical waveguide 410, as described below. Photonic detector 420 includes at least one electrode 430, which may be composed of a metal such as aluminum, copper, or titanium, for example. Photonic detector 420 may be fabricated using wafer bonding and other existing manufacturing processes such as complementary metal oxide semiconductor (CMOS) semiconductor manufacturing processes.

The operably connected end of optical waveguide 410 is curved at an angle of $\theta_1$, with a corresponding radius of curvature $r_1$. The curved portion of optical waveguide 410 may be formed using a lithographic process. Radius of curvature $r_1$ may be constant along the curve of optical waveguide 410, or alternatively may vary as a function of angle $\theta_1$. If radius of curvature $r_1$ is sufficiently small (i.e., is equal to or less than the "critical radius"), thereby creating a sharp enough curve in optical waveguide 410, the evanescent wave from optical waveguide 410 leaves optical waveguide 410 and propagates radially towards photonic detector 420. The critical radius of waveguide 410 will depend on the width of the inner core 412, and the materials and respective refraction indexes for the inner core 412 and the outer cladding 414. For an optical waveguide 410 including, for example, a 300 nm wide Si inner core 412 and a $SiO_2$ outer cladding, radius $r_1$ may be equal to or less than 1 μm.

Figure 5:
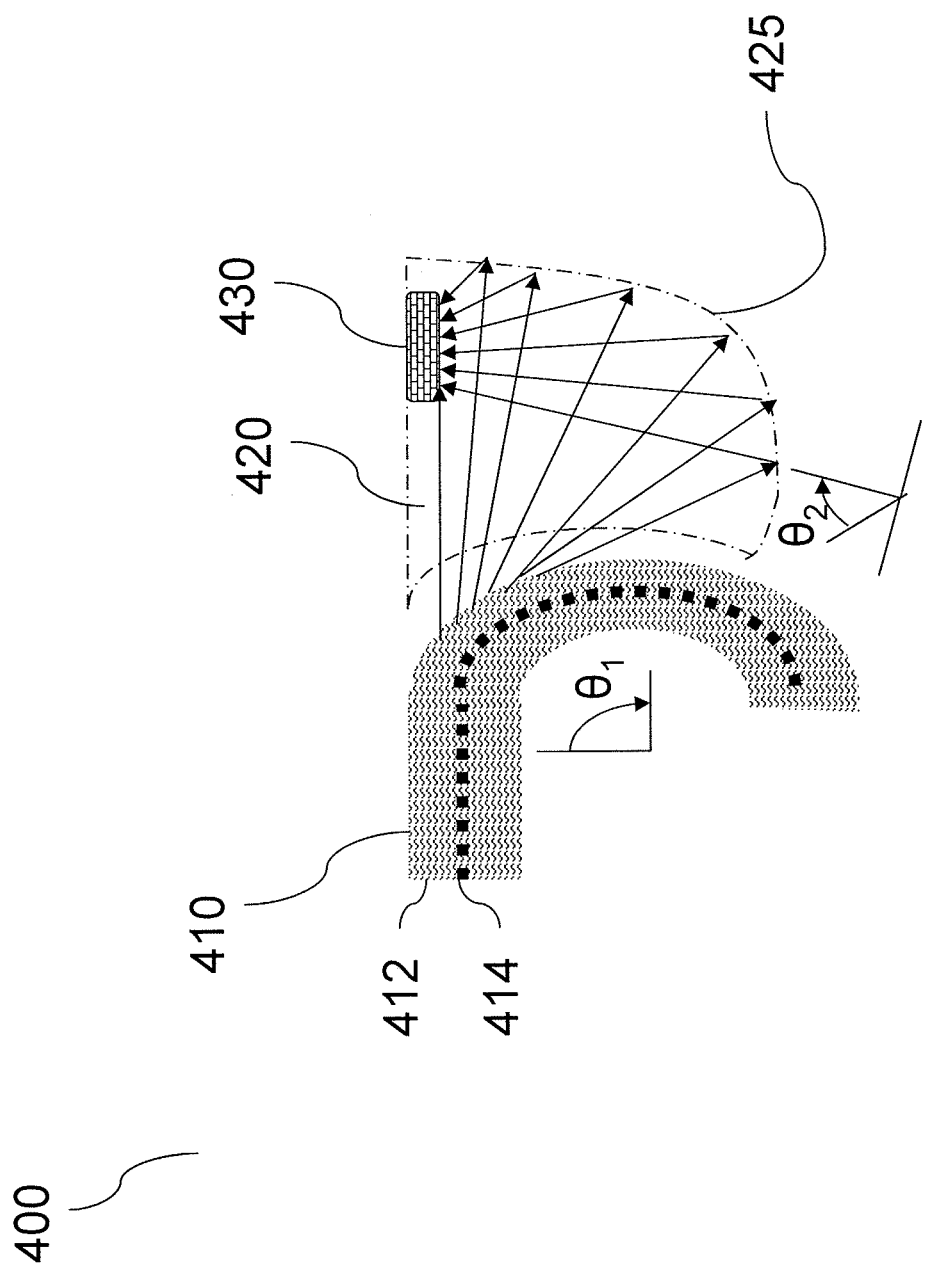
FIG. 5 illustrates a top-down view of optical paths in an optical connection, in accordance with embodiments described herein.

FIG. 5 illustrates a top-down view of the paths of evanescent waves propagating radially from optical waveguide 410 to photonic detector 420 in optical connection 400.

The semiconductor material used to form photonic detector 420 may be shaped to reflect the propagated evanescent waves to a common point (e.g., electrode 430). The semiconductor material may be shaped using, for example, a lithographic process, such as electron-beam lithography, or through etching techniques. The reflecting edge 425 of photonic detector 420 is preferably in a range of about 5-15 μm from optical waveguide 410, providing an adequate path length for the wavelengths of the propagated evanescent waves while allowing for a compact photonic detector 420.

The radially propagated evanescent waves received by photonic detector 420 can be reflected at a substantially uniform angle $\theta_2$ from edge 425 towards electrode 430. For example, the reflecting edge 425 of photonic detector 420 may be shaped to reflect the evanescent waves at approximately a 20° angle towards electrode 430. In other embodiments, angle $\theta_2$ may change as a function of its distance from optical waveguide 410. Selecting a common point for electrode 430 that is relatively close (i.e., within 10 μm) to optical waveguide 410 allows for a smoother reflecting edge 425, because complicated reflection points are not required.

In order to better promote reflectivity of the optical beams, the photonic detector 420 may be formed of a material having a higher refractive index than the surrounding substrate. For example, a germanium (Ge) photonic detector 420 having an index of refraction of approximately 4.34 may be used in a substrate of $SiO_2$, which has a refractive index of approximately 1.5. Other materials may also be used to form the photonic detector 420, such as InP, SiGe, GaAs, and other appropriate materials.

Figure 6:
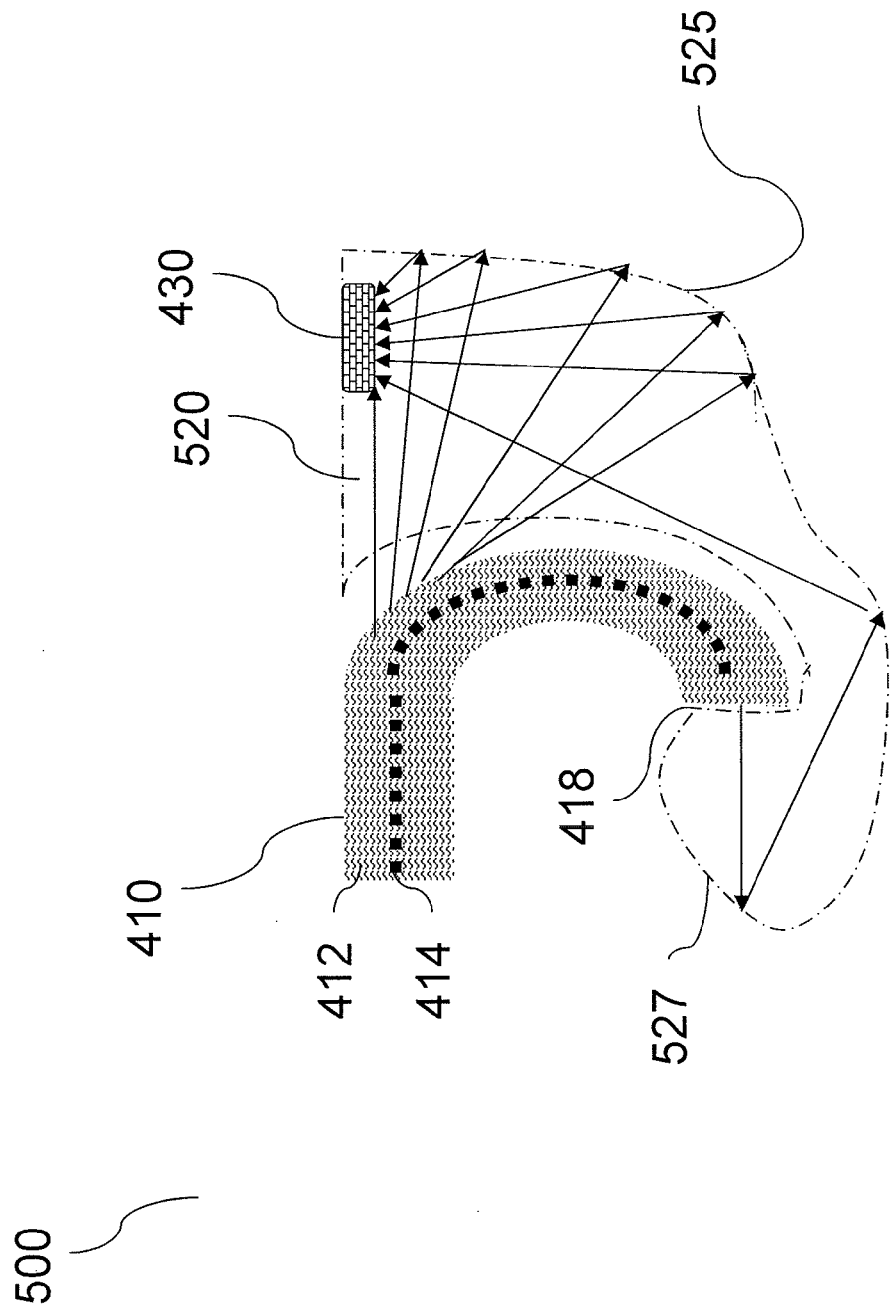
FIG. 6 illustrates a top-down view of optical paths in another optical connection, in accordance with embodiments described herein.

FIG. 6 illustrates a top-down view of optical paths in an optical connection 500 in another embodiment of a photonic detector 520. Photonic detector 520 includes a shaped reflecting edge 525 similar to edge 425 described above in connection with FIG. 4, in order to reflect evanescent waves propagated radially from optical waveguide 410 due to bending loss. In addition, a bottom portion of photonic detector 520 is butt-coupled to the terminal point 418 of optical waveguide 410, in order to couple any remaining optical beam from inner core 414 to photonic detector 520. The optical beam is reflected from another reflecting edge 527 of photonic detector 520, and may be reflected several times prior to reaching the common point (e.g., electrode 430). Photonic detector 520 may be fabricated using wafer bonding and other existing manufacturing processes such as complementary metal oxide semiconductor (CMOS) semiconductor manufacturing processes.

Figure 1:
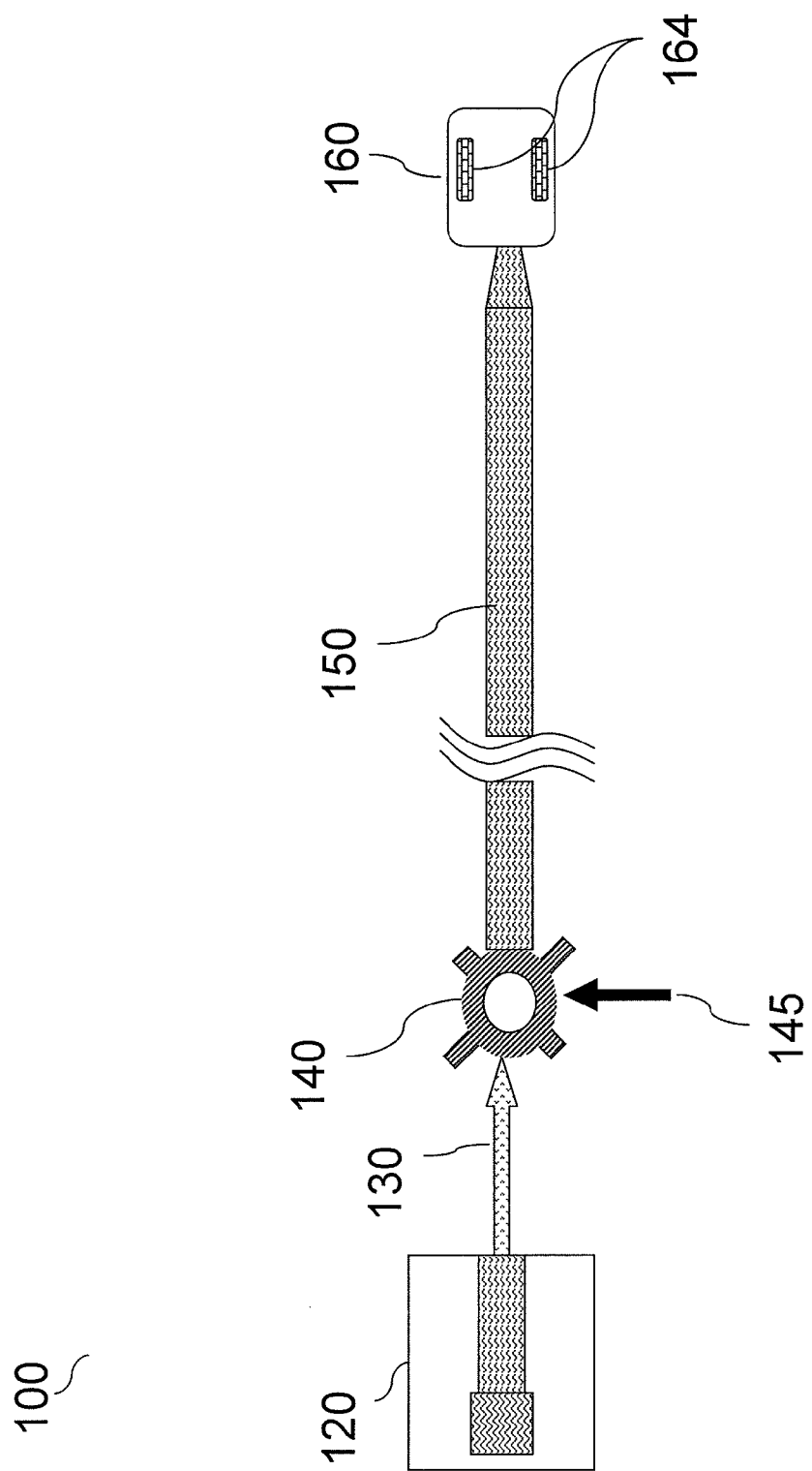
FIG. 1 is a block diagram of a conventional electronic-photonic device.
Figure 3B:
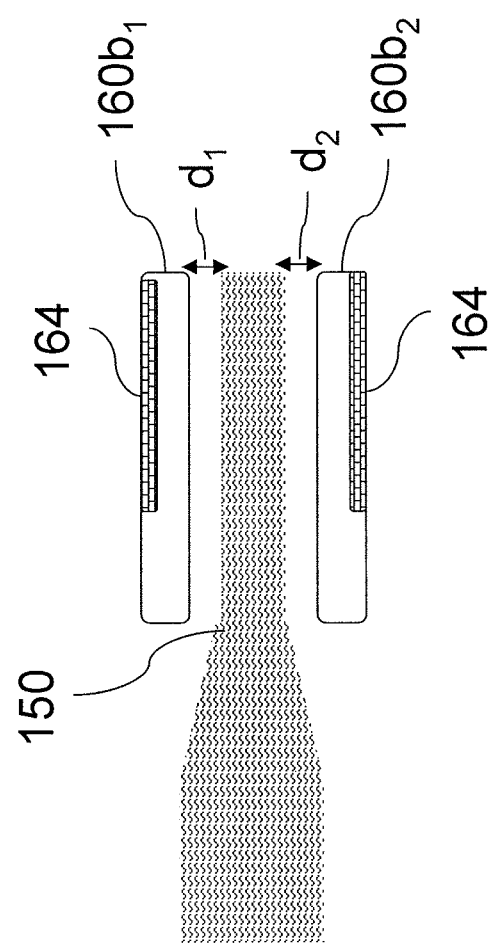

Optical connections including an optical waveguide 410 and/or a photonic detector 420, 520 as described in connection with FIGS. 4-6 may be used in various electronic-photonic devices. For example, the optical connections could be used with inter-chip or intra-chip systems including at least one light source 120 and modulator 140 (FIG. 1), such as to connect multiple memory elements (e.g., one or more cores or DRAM, SDRAM, SRAM, ROM, or other type of solid-state or static memory elements).

The above description and drawings are only to be considered illustrative of specific embodiments, which achieve the features and advantages described herein. Modification and substitutions to specific processes, components, and structures can be made. For example, it should be understood that appropriate types of semiconductor materials and memory elements other than those specifically described in connection with the above embodiments may be used. Accordingly, the embodiments of the invention are not to be considered as being limited by the foregoing description and drawings, but only by the scope of the appended claims.

What is claimed as new and desired to be protected by Letters Patent of the United States is:

1. An optical connection comprising:
    an optical waveguide configured to carry an optical beam wherein the optical waveguide includes a curved portion configured to emit radially propagating evanescent waves corresponding to the optical beam; and
    a photonic detector operably connected to the optical waveguide for receiving the evanescent waves from the curved portion of the optical waveguide;
    the photonic detector comprising at least one reflecting edge shaped to internally reflect the radially propagating evanescent waves to a common point.

2. The optical connection of claim 1, wherein the common point is a location of an electrode.

3. The optical connection of claim 1, wherein the optical waveguide comprises an inner core composed of a material having a first refractive index and an outer cladding composed of a material having a second refractive index.

4. The optical connection of claim 3, wherein the first refractive index is greater than the second refractive index.

5. The optical connection of claim 3, wherein the inner core has a width in a range of approximately 300 nm to 500 nm.

6. The optical connection of claim 5, wherein the curved portion of the optical waveguide has a radius of curvature of approximately 1 μm.

7. The optical connection of claim 3, wherein the inner core comprises silicon and the outer cladding comprises silicon dioxide.

8. The optical connection of claim 1, wherein the optical waveguide and the photonic detector are integrated on a common substrate.

9. The optical connection of claim 8, wherein the optical waveguide comprises:
    an outer cladding composed of a first material formed on the common substrate; and an inner core composed of a second material formed in the first material.

10. The optical connection of claim 1, the optical waveguide further comprising a terminal end and the photonic detector having a portion thereof optically coupled to the terminal end of the optical waveguide.

11. The optical connection as in claim 10, wherein the photodetector portion is butt coupled to the terminal end.

12. The optical connection of claim 11, wherein the portion of the photonic detector that is butt-coupled to the terminal end of the optical waveguide comprises a second reflecting edge configured to reflect an optical beam emitted from the terminal end to the common point.

13. A method of forming an optical connection, the method comprising:
    providing a cladding material on a substrate; patterning an inner core of an optical waveguide in the cladding material, wherein the inner core includes a curved portion configured to emit radially propagating evanescent waves corresponding to an optical beam carried by the inner core; and forming a photonic detector for receiving the radially propagated evanescent waves, wherein the photonic detector comprises at least one reflecting edge shaped to reflect the radially propagated evanescent waves to a common point.

14. The method of claim 13, further comprising forming an electrode at the common point.

15. The method of claim 13, wherein patterning the inner core comprises patterning a silicon inner core having a width in a range of approximately 300 to 500 nm and a radius of curvature that is less than or equal to approximately 1 μm.

* * * * *